United States Patent
Lesea

(10) Patent No.: US 6,914,804 B2
(45) Date of Patent: *Jul. 5, 2005

(54) MEMORY CELLS ENHANCED FOR RESISTANCE TO SINGLE EVENT UPSET

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/787,327

(22) Filed: Feb. 26, 2004

(65) Prior Publication Data

US 2004/0165417 A1 Aug. 26, 2004

Related U.S. Application Data

(62) Division of application No. 10/125,666, filed on Apr. 17, 2002, now Pat. No. 6,735,110.

(51) Int. Cl.$^7$ .............................. G11C 11/00; G11C 5/06
(52) U.S. Cl. ......................... 365/154; 365/72; 365/148; 365/155; 365/156
(58) Field of Search ................................. 365/154, 148, 365/155, 156, 72

(56) References Cited

U.S. PATENT DOCUMENTS

| | | | |
|---|---|---|---|
| 4,725,875 A | | 2/1988 | Hsueh |
| 4,852,060 A | | 7/1989 | Rockett, Jr. |
| 4,884,238 A | | 11/1989 | Lee et al. |
| 4,903,094 A | | 2/1990 | Plus et al. |
| 4,956,814 A | * | 9/1990 | Houston ..................... 365/154 |
| 5,018,102 A | | 5/1991 | Houston |
| 5,126,279 A | * | 6/1992 | Roberts ..................... 438/210 |
| 5,189,598 A | | 2/1993 | Bolan et al. |
| 5,212,108 A | | 5/1993 | Liu et al. |
| 5,301,146 A | * | 4/1994 | Hama ........................ 365/154 |
| 5,307,142 A | * | 4/1994 | Corbett et al. .............. 365/156 |
| 5,311,070 A | * | 5/1994 | Dooley ....................... 327/208 |
| 5,631,863 A | | 5/1997 | Fechner et al. |
| 5,889,431 A | * | 3/1999 | Csanky ....................... 327/543 |
| 6,058,041 A | * | 5/2000 | Golke et al. ................. 365/156 |
| 6,111,780 A | | 8/2000 | Bertin |
| 6,172,907 B1 | * | 1/2001 | Jenne ..................... 365/185.18 |
| 6,180,984 B1 | * | 1/2001 | Golke et al. ................. 257/347 |
| 6,252,433 B1 | | 6/2001 | Stecklein |
| 6,271,568 B1 | * | 8/2001 | Woodruff et al. ........... 257/379 |
| 6,278,287 B1 | | 8/2001 | Baze |
| 6,369,630 B1 | | 4/2002 | Rockett |
| 2002/0109230 A1 | * | 8/2002 | Woodbury et al. .......... 257/754 |

FOREIGN PATENT DOCUMENTS

| | | |
|---|---|---|
| EP | 0 281 741 A | 9/1988 |
| FR | 2 353 928 a | 12/1977 |

* cited by examiner

Primary Examiner—Hoai Ho
Assistant Examiner—Ly Duy Pham
(74) Attorney, Agent, or Firm—W. Eric Webostad; Edel M. Young; Lois D. Cartier

(57) ABSTRACT

Method and apparatus are described for providing memory cells enhanced for resistance to single event upsets. In one embodiment, transistors are coupled between cross coupled inverters of a latch, thus in a small area providing both single-event-upset resistivity most of the time, and high speed during writing to the memory cell. Alternatively, inductors coupled between inverters of a latch may be used.

3 Claims, 9 Drawing Sheets

MEMORY CELLS ENHANCED FOR RESISTANCE TO SINGLE EVENT UPSET

FIELD OF THE INVENTION

The present invention relates generally to circuitry enhanced for resistance to single event upset (SEU).

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic devices, called a field programmable gate array (FPGA), is very popular because of a superior combination of capacity, flexibility, time-to-market, and cost. An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

A well-studied occurrence in circuitry is called "Single Event Upset." Single Event Upset or SEU is a change in state of a circuit, conventionally a bit storing circuit such as a dynamic random access memory (DRAM) cell, latch, static random access memory (SRAM) cell and the like, caused by an external energy source, such as alpha particles, cosmic rays, energetic neutrons and the like. The seriousness of SEU is increasing as transistor channel length, oxide thickness, and width continue to decrease. Since the geometries have moved to less than 0.25 microns, the problem has been significant enough that efforts are being made to overcome or decrease the seriousness of SEU events.

In a conventional DRAM or SRAM, an SEU may be addressed with error correction. In fact, error-correcting memory is widely commercially available. However, this is not an efficient option for memory used to configure an FPGA, because configuration memory cells are used to define how the CLBs, IOBs, and interconnect structure are configured. Because an individual memory cell is used for control, conventionally without decoding, if a memory cell changes state owing to an SEU, then a logic function under control of such a memory cell may change.

An approach to handling an SEU condition in an FPGA is triple modular redundancy (TMR), namely, use of three sets of memory cells and configurable logic in place of one, where outcome of at least two of the three sets controls FPGA operation. However, this adds considerable cost.

Others have attempted to increase resiliency to an SEU for a memory cell. Referring to FIG. 1, there is shown a schematic diagram of an SEU hardened memory cell 10 of the prior art. Memory cell 10 is a latch having cross-coupled inverters 12 and 14. Resistors 13 and 15 are coupled to respective outputs of inverters 12 and 14. In order to provide SEU resiliency, resistors 13 and 15 each have a resistance of approximately one mega-ohm. Input voltage, Vin 11, is inverted or complemented by inverter 12 to provide output voltage, Vout 12, which voltage drop is SEU hardened owing to voltage drop across resistor 13, and Vout 12 is inverted by inverter 14 to provide Vin, which voltage drop is SEU hardened owing to voltage drop across resistor 15. Unfortunately, formation of a resistor having a resistance sufficient to harden a latch against an SEU consumes a relatively large amount of area, slows performance, and creates complexity for integration with complementary-metal-oxide semiconductor (CMOS) process. Others have used capacitive loading at an input of an inverter 12 or 14; however, capacitive loading also slows performance of latch 10.

Accordingly, it would be desirable and useful to provide an SEU-resistive memory circuit suitable for integration with a CMOS process. Moreover, it would be desirable and useful to provide an SEU-resistive memory circuit that does not consume as much semiconductor wafer area as other SEU-resistive memory circuits and allows for high speed writing, and high SEU resistance when reading.

SUMMARY OF THE INVENTION

According to one embodiment of the invention, resistors between cross-coupled inverters are formed from transistors having a high resistance mode in which resistance is on the order of one to several mega-ohms and a low resistance mode in which resistance is a few hundred ohms. In a method of operating this circuit, the circuit is held in its high-resistance mode when not being written to, which is a great majority of the time, and brought to the low resistance mode only for writing. The circuit thus benefits from the SEU-resistivity most of the time, but the circuit also has high performance during a write operation. Further, the area requirement of a resistive transistor is less than the area requirement of a passive resistor, and thus area requirement of the structure is smaller than the prior art structure of FIG. 1.

In another embodiment, two cross coupled inverters have inductors inserted between them, positioned so that writing to the two inverters does not pass current through the inductors. Thus, a transient upset to one of the inverters is not readily carried to the other inverter (causing the memory cell to flip) because it is slowed by the inductor, but a write signal applied directly to the inverter does cause it to flip, as desired.

In another embodiment, transistors are inserted between the two cross-coupled inverters as discussed above, but have gates that are not controllable, being held in their high resistance mode. This embodiment is smaller and simpler to use, and still benefits from the smaller area of a resistive transistor.

In yet another embodiment, gates of CMOS transistors are held at a constant voltage during operation, but the substrate forming the channel regions is controllable. Thus these transistors operate much like bipolar transistors, and benefit from both variable resistance (SEU-resistivity and high speed) and small area.

In another embodiment, control is provided for both the gate and channel voltages.

In still another embodiment, separate transistors are placed between the output of one inverter and the gates of the PMOS and NMOS transistors of the other inverter and they are separately controllable. Preferably an NMOS transistor is placed in the path to the gate of the NMOS transistor of the inverter and a PMOS transistor is placed in the path to the gate of the PMOS inverter transistor. The NMOS transistor is good at passing a high voltage and thus maintains the NMOS inverter transistor fully on during writing. Likewise, the PMOS transistor is good at passing a low voltage and can maintain the PMOS transistor fully on during writing. More importantly for SEU protection, an NMOS transistor is relatively poor at passing a low voltage, and a PMOS transistor is relatively poor at passing a high voltage, which helps when the driving node is momentarily affected by SEU. This is true because an SEU event hitting a PMOS transistor that has been off will cause that transistor to pull high, momentarily passing an erroneous high to the other inverter. Thus, if an environment into which devices having these circuits is placed causes a particular kind of SEU, separate adjustment of transistors providing resistance to the gates of the PMOS and NMOS transistors in the inverters can be made.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
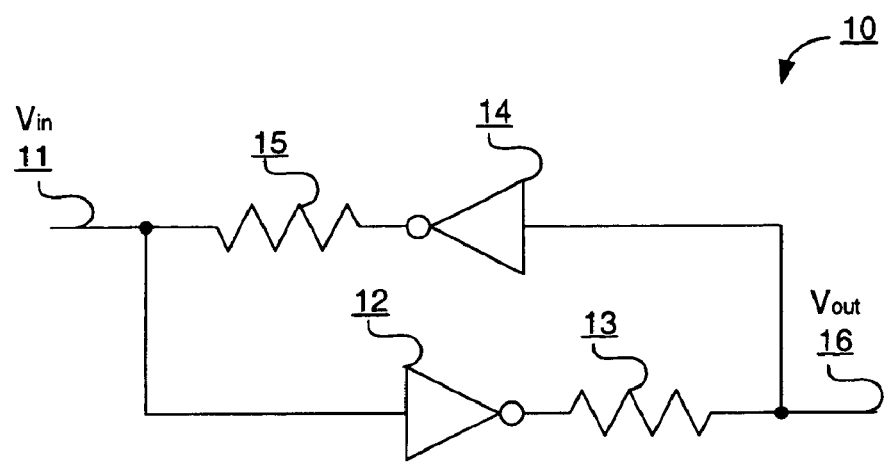
FIG. 1 is a schematic diagram of an SEU hardened memory cell of the prior art.
Figure 2:
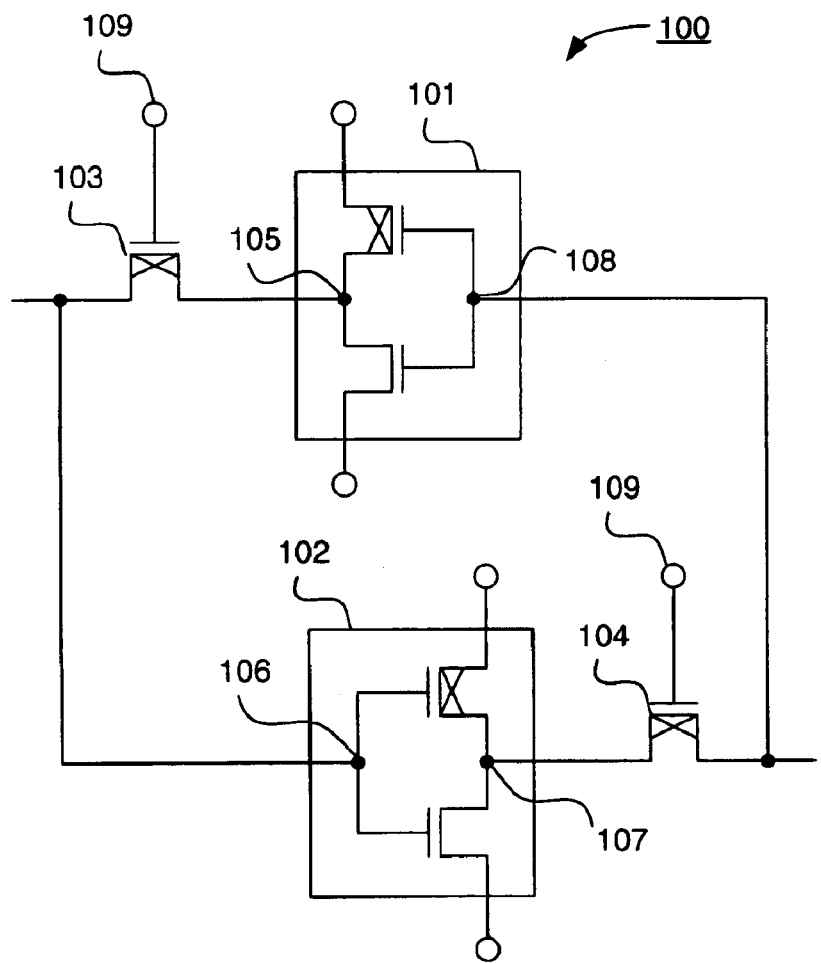
FIG. 2 is a schematic diagram of an exemplary embodiment of a latch in accordance with one or more aspects of the present invention.

Referring to FIG. 2, there is shown a schematic diagram of an exemplary embodiment of a latch 100 in accordance with one or more aspects of the present invention. Latch 100 comprises cross-coupled inverters 101 and 102. Between inverters 101 and 102 are PMOS transistors 103 and 104. More particularly, PMOS transistor 103 is connected to an output node 105 of inverter 101 at one source/drain contact and an input node 106 of inverter 102 at another source/drain contact. PMOS transistor 104 is connected to an output node 107 of inverter 102 at one source/drain contact and an input node 108 of inverter 101 at another source/drain contact. In other words, PMOS transistor 103 is connected in series with inverter 101, and PMOS transistor 104 is connected in series with inverter 102.

Bodies of transistors 103 and 104 are floating, and gates of PMOS transistors 103 and 104 may have a gate bias voltage 109 applied thereto. Gate bias voltage 109 may be at approximately above ground potential to a potential that will only weakly turn on PMOS transistors 103 and 104, conventionally 0.3 volts below Vdd. Moreover, PMOS transistors 103 and 104 are formed such that they conduct when in an off state. In other words, PMOS transistors 103 and 104 are sufficiently leaky even when in an off state such that they appear as a resistive load. Conventionally, transistors formed using 0.20 micron and small lithography will produce such a desired leakage.

Figure 3:
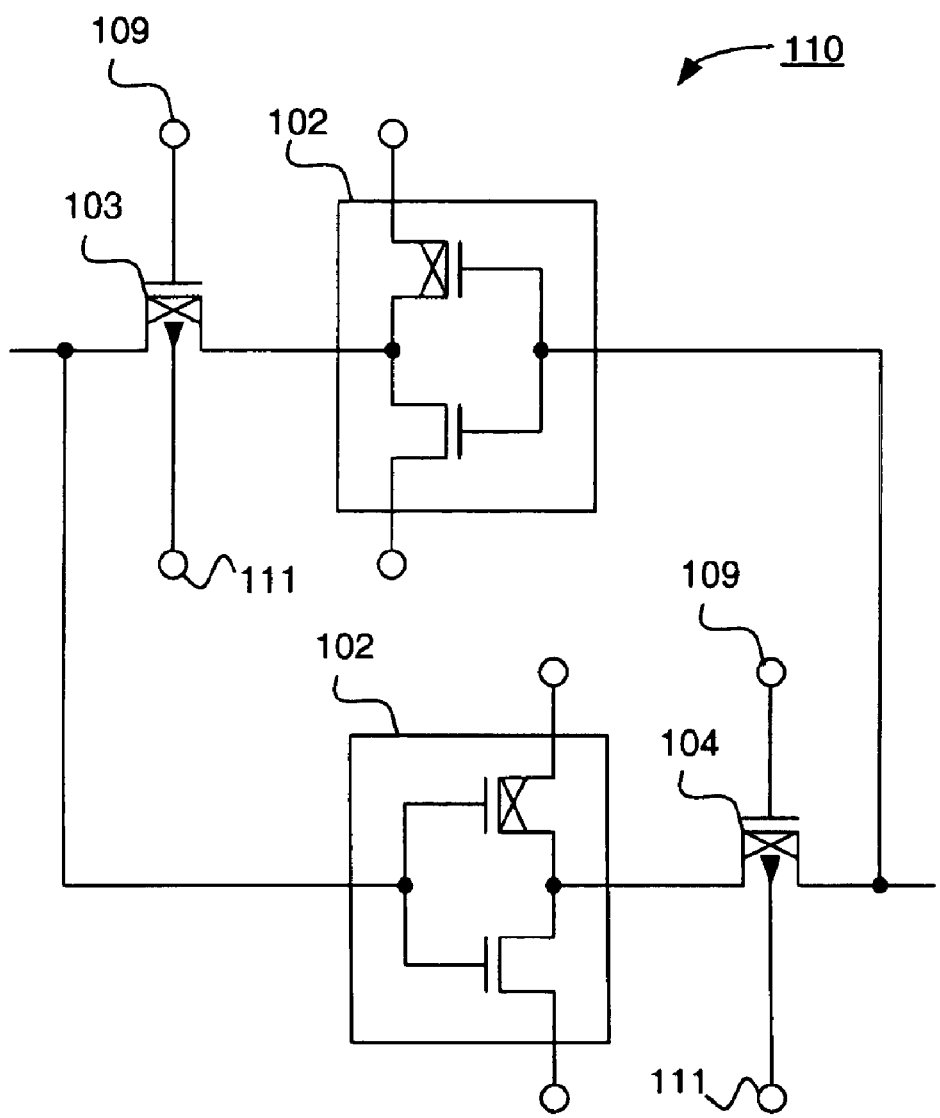
FIG. 3 is a schematic diagram of an exemplary alternative embodiment of a latch in accordance with one or more aspects of the present invention.

Referring to FIG. 3, there is shown a schematic diagram of an exemplary embodiment of a latch 110 in accordance with one or more aspects of the present invention. Latch 110 of FIG. 3 is similar to latch 100 of FIG. 2, except, that gate bias voltage 109 is at ground, and bodies of PMOS transistors 103 and 104 have a body bias voltage 111 applied thereto. Advantageously, a floating body bias will self-regulate, attaining a voltage for providing a high impedance.

While not wishing to be bound by theory, it is believed that cosmic rays, alpha particles, energetic neutrons and like external energy sources strike a semiconductor device and penetrate into a substrate of such a semiconductor device. It is believed that along such a path of penetration, there is a creation of electrons and holes. This creation of electrons and holes facilitates conduction from source to drain and to a body bias voltage. With respect to such conduction, a transistor susceptible to an SEU will go into an active or partially active state, namely, completely or partially "turn on." Thus, a conduction path may exist from a body bias voltage across such a transistor. Conventionally, body bias voltage for an NMOS transistor is ground potential, and body bias voltage for a PMOS transistor is Vdd. Thus, in response to an SEU, an NMOS transistor will communicate a first logic level voltage or a "low" state, and a PMOS transistor will communicate a second logic level voltage or a "high" state. However, to provide a resistive load on an output of an inverter to mitigate against an SEU, a PMOS transistor is preferable over an NMOS transistor. This is because a PMOS transistor is less susceptible to communication of negative charge than an NMOS transistor, and injection of negative charge accumulation is an unwanted consequence of injection of SEU external energy.

With respect of FIG. 2, by having PMOS transistors 103 and 104 leaking and floating, they appear as resistive loads to negative charge carriers. Moreover, this resistivity may be tuned by semiconductor process controls for leakiness of such PMOS transistors 103 and 104, application of a gate bias voltage 109, or a combination of both. Accordingly, PMOS transistors 103 and 104 are configured to have an effective resistance of at least one mega-ohm. Notably, though PMOS transistors 103 and 104 may be sized to provide such a resistance, PMOS transistors 103 and 104 may be made by a same or substantially similar process as used in formation of PMOS transistors of inverters 101 and 102. Thus, process compatibility with formation of PMOS transistors of inverters 101 and 102 is facilitated, as well as consuming less semiconductor wafer area as compared with a resistor having an equivalent resistance.

With respect to FIG. 3, by having PMOS transistors 103 and 104 that are leaky with a body bias voltage 111, such PMOS transistors appear as resistive loads to negative charge carriers. This resistivity may be tuned by semiconductor process controls for leakiness used in forming such PMOS transistors 103 and 104, application of body bias voltage 111, or a combination of both. Accordingly, PMOS transistors 103 and 104 are configured to have an effective resistance of at least one mega-ohm. Notably, though PMOS transistors 103 and 104 may be sized to provide such a resistance, PMOS transistors 103 and 104 may be made by a same or substantially similar process as used in formation of PMOS transistors of inverters 101 and 102. Even though, a separate contact for body bias voltage 111 is used, consuming semiconductor wafer area, process compatibility with formation of PMOS transistors of inverters 101 and 102 is facilitated, as well as consuming less semiconductor wafer area than a resistor having an equivalent resistance.

Figure 4:
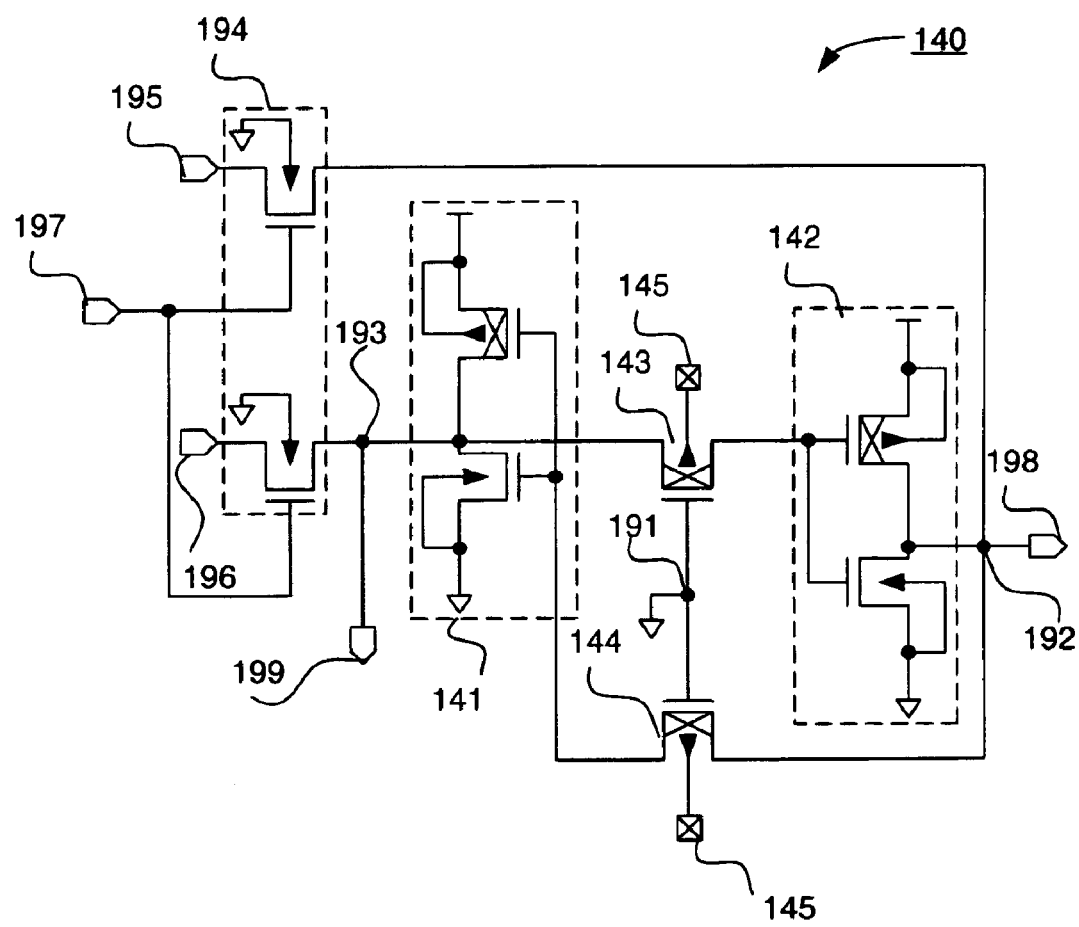
FIGS. 4 and 4A are schematic diagrams of respective exemplary embodiments of memory cells in accordance with one or more aspects of the present invention.

Referring to FIG. 4, there is shown a schematic diagram of an exemplary embodiment of a memory cell 140 in accordance with one or more aspects of the present invention. Memory cell 140 comprises cross-coupled inverters 141 and 142 having PMOS transistors 143 and 144 connected between such inverters. PMOS transistors 143 and 144 are coupled to body bias contacts for supplying a body bias voltage 145. Gates of PMOS transistors 143 and 144 are grounded, and thus PMOS transistors 143 and 144, absent more, are in an on state. However, body bias voltage 145 is adjusted to provide a desired resistivity for PMOS transistors 143 and 144. In other words, body bias voltage 145 is used to make PMOS transistors 143 and 144 partially non-conductive to appear as a resistor having a significantly large resistance. As mentioned above, such a resistance may be tailored or tuned using application of body bias voltage 145 according to leakiness of PMOS transistors 143 and 144.

Memory cell 140 comprises data signal inputs 195 and 196 for receiving a data signal and its complement, respectively. An address or select signal input 197 is provided to gates of transistors of select circuit 194 to enable passing of data from data signal inputs 195 and 196 to cross coupled inverters 141 and 142. Passed data is provide at output nodes 192 and 193 of inverters 142 and 141, respectively. Data signal outputs 198 and 199 are for outputting stored data and its complement, respectively.

Figure 4A:
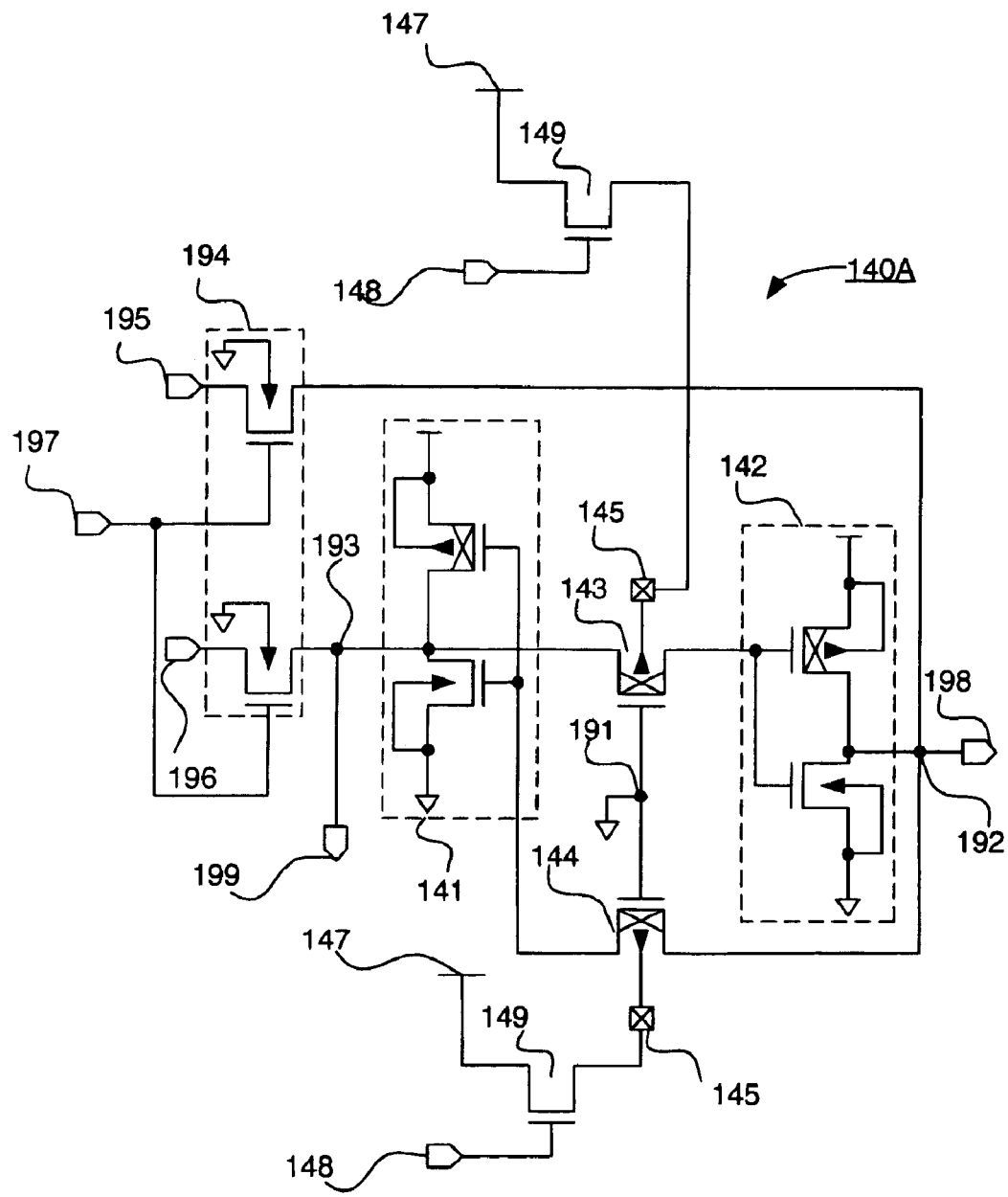

Referring to FIG. 4A, there is shown a schematic diagram of an exemplary embodiment of a memory cell 140A in accordance with one or more aspects of the present invention. Memory cell 140A is similar to memory cell 140 of FIG. 4, with an addition of transistors 149 coupled in series with nodes 145 and a source voltage 147, such as Vdd. Though NMOS transistors are shown, it will be apparent that PMOS transistors may be used. When a gating voltage 148 is applied to gates of transistors 149 to make them conductive, source voltage 147 is provided to nodes 145. Accordingly, body biasing of transistors 143 and 144 to Vdd puts memory cell 140A in a condition for writing or reading, instead of an SEU resistive condition. When a gating voltage 148 is applied to gates of transistors 149 to make them non-conductive, nodes 145 are left to float. Accordingly, bodies of transistors 143 and 144 float, thereby putting memory cell 140A in an SEU resistive condition.

Figure 5:
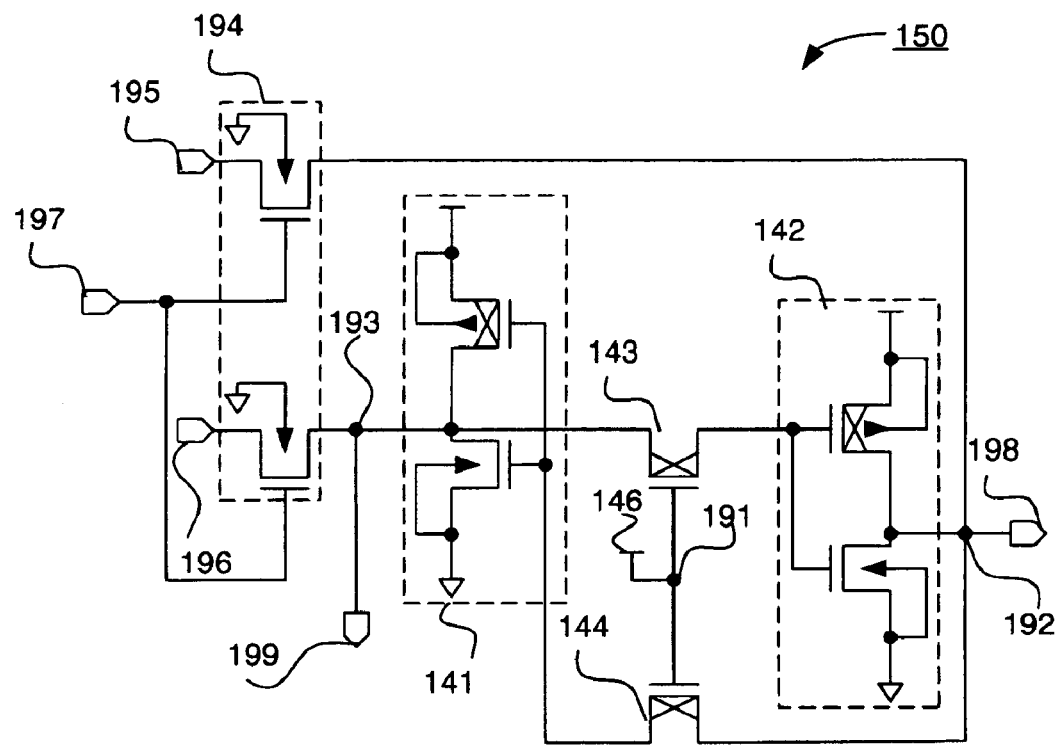
FIG. 5 is a schematic diagram of an alternative exemplary embodiment of a memory cell in accordance with one or more aspects of the present invention.

Referring to FIG. 5, there is shown a schematic diagram of an exemplary embodiment of a memory cell 150 in accordance with one or more aspects of the present invention. Memory cell 150 is different from memory cell 140 of FIG. 4 in that PMOS transistors 143 and 144 have floating bodies and biased gates. A bias voltage 146 is applied to gates of PMOS transistors 143 and 144 to put them in a partially off state. In other words, PMOS transistors 143 and 144 are partially conductive to appear as resistors having a significantly large resistance. As mentioned above, such a resistance may be tailored or tuned by gate bias voltage 146 according to leakiness of PMOS transistors 143 and 144.

Figure 6:
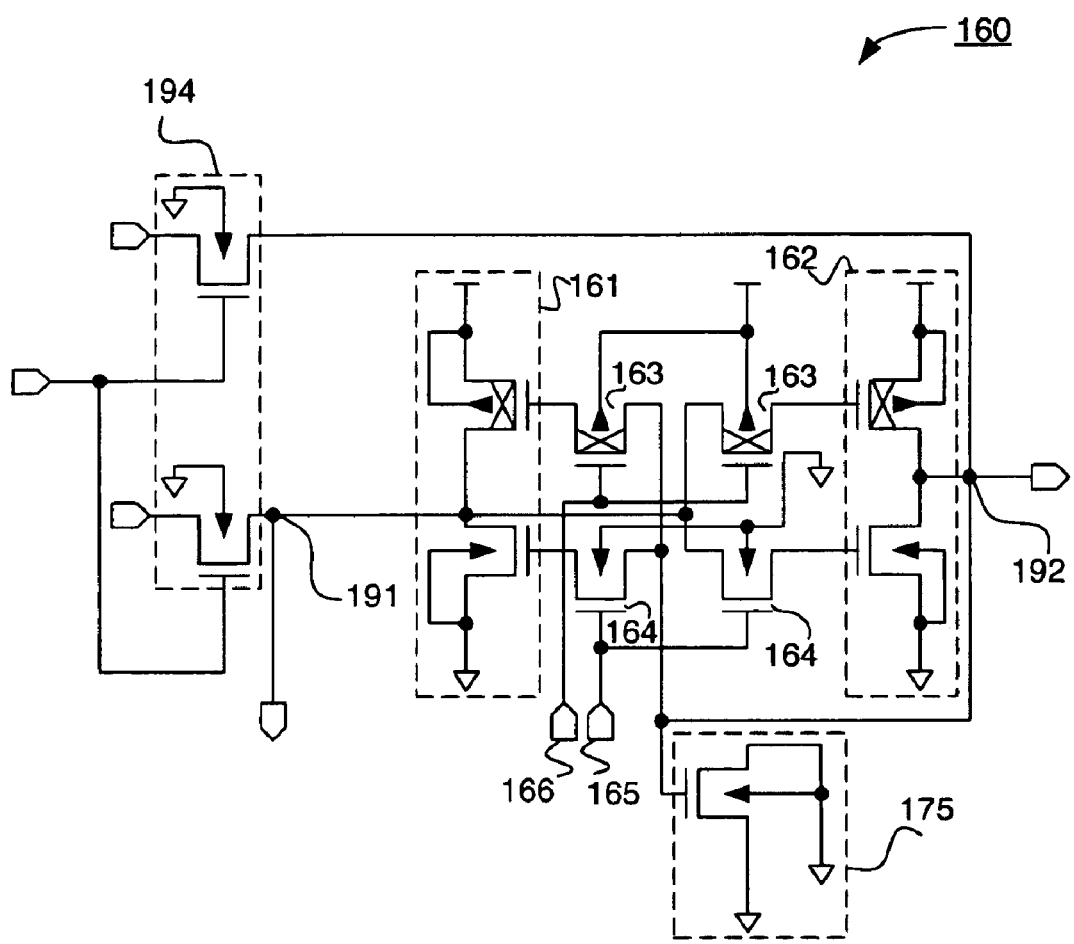
FIGS. 6 and 6A are schematic diagrams of an alternative exemplary embodiment of a memory cell in accordance with one or more aspects of the present invention.
Figure 6A:
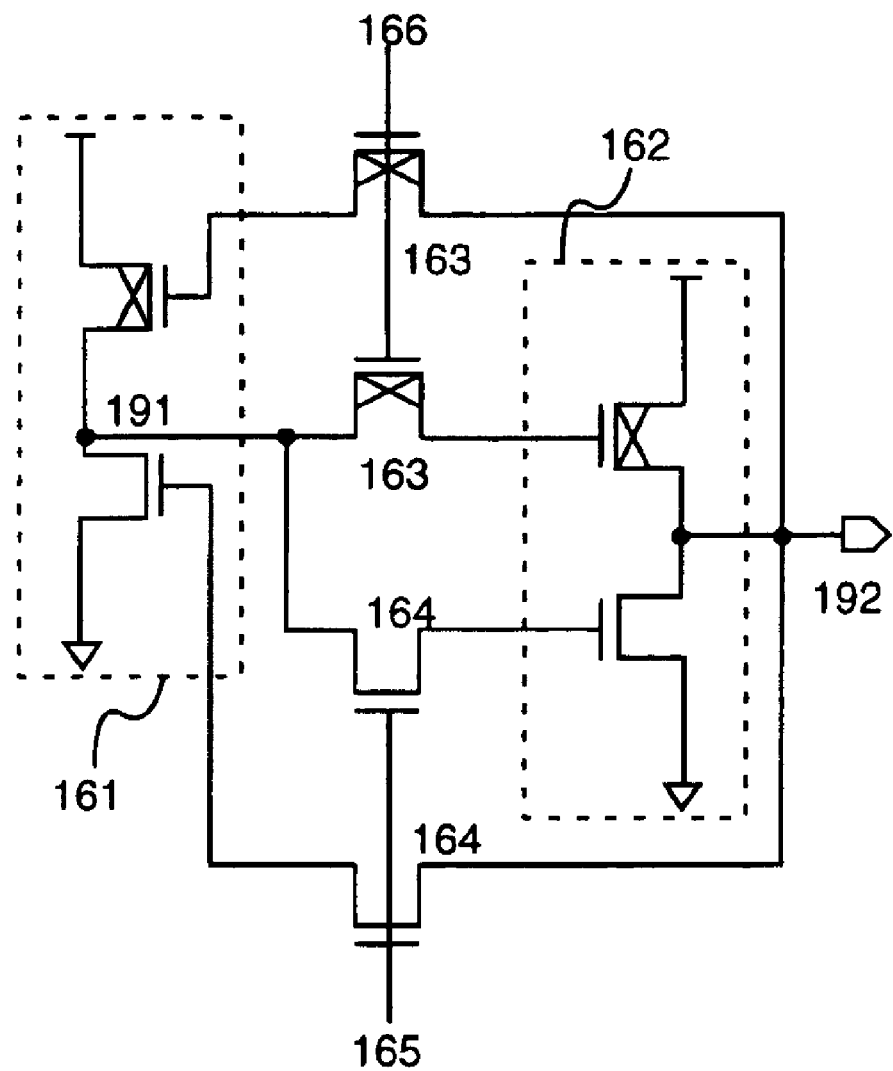

FIG. 6A shows a simplified version of an embodiment of the invention that provides separately controlled resistive paths between the output of one inverter of the cross coupled latch and the PMOS and NMOS transistors of the other inverter of the cross coupled latch. This embodiment allows separately selected resistances to gates of the PMOS and NMOS transistors. PMOS transistors 163 control the resistance in the paths to PMOS transistors of inverters 161 and 162. These transistors 163 are controlled by an enable signal 166. The NMOS transistors in inverters 161 and 162 are controlled by NMOS transistors 164, which are controlled by an enable signal 165. The voltages of these two enable signals 165 and 166 are typically controlled to raise or lower resistances through their respective transistors together, but not necessarily to the same degree. The circuit typically includes additional elements, as shown in FIG. 6.

Referring to FIG. 6, there is shown a schematic diagram of an exemplary embodiment of a memory cell 160 in accordance with one or more aspects of the present invention. In contrast to the exemplary embodiments of memory cells 140 and 150 of FIGS. 4 and 5, memory cell 160 has a pair of PMOS transistors 163 formed from a CMOS process, and thus a pair of NMOS transistors 164 is also present. Enable signal 165 is provided to gates of NMOS transistors 164, and enable signal 166, which may be a complement of enable signal 165, is provided to gates of PMOS transistors 163. Enable signal 165 is brought high to write or read memory cell 160 at an operational speed, and then brought low to return to a slower than operational speed SEU protective mode.

PMOS transistors 163 are connected at respective source/drains to inputs of inverters 161 and 162, more particularly to respective gates of PMOS transistors of inverters 161 and 162. Other source/drains of transistors 163 are connected to respective output nodes 191 and 192 of inverters 161 and 162. In this configuration, PMOS transistors 163 are respectively coupled to PMOS inputs of inverters 161 and 162 and to output nodes 191 and 192 of inverters 161 and 162.

NMOS transistors 164 are connected at respective source/drains to inputs of inverters 161 and 162, more particularly to respective gates of NMOS transistors of inverters 161 and 162. Other source/drains of transistors 164 are connected to output nodes 191 and 192 of inverters 161 and 162, respectively. In this configuration, NMOS transistors 164 are coupled to NMOS inputs of inverters 161 and 162 and to output nodes 191 and 192 of inverters 161 and 162.

PMOS transistors 163 have a body bias voltage of Vdd, and NMOS transistors 164 have a body bias voltage of ground, which is consistent with transistors of inverters 161 and 162. Accordingly, it should be appreciated that memory cell 160 is conveniently manufactured by a single process. However, transistors 163 and 164 may be sized equivalent to or different from one or more transistors of inverters 161 and 162.

It should be appreciated that transistors 163 and 164 may have a gate bias voltage applied or a body bias voltage applied, or both, for providing resistive loads in accordance with one or more aspects of the present invention, as described elsewhere herein. Moreover, NMOS transistors may be used in place of PMOS transistors described elsewhere herein for providing resistive loading. If body bias is floating, then the gate of a PMOS or NMOS transistor is tied low or high, respectively, depending upon whether writing is occurring. When body bias is not floating, then gate bias voltage in the high resistance protective mode would be a sub-threshold voltage, which will depend on transistor manufacture, though it may be approximately 0.1 volts to 0.3 volts. Notably, when body bias is not floating, gate bias voltage will depend on transistor manufacture, though it may be approximately Vdd minus 0.1 volts to Vdd minus 0.3 volts. So a high impedance may be obtained for a transistor by letting its body bias float, by applying a gating voltage, or by a combination of both.

With enable signals 165 and 166 complements of one another, transistors 163 and 164 may be turned on for a read or write state. Moreover, enable signals 165 and 166 may be used to partially turn on transistors 163 and 164 for an SEU resistant state, as mentioned above.

In an SEU hardened state, it should be appreciated that transistors 163 and 164 are leaky, and thus appear as resistive loads when in a partially off state. Though PMOS transistors 163 are preferable for this purpose, NMOS transistors 164 do provide resistive loading for purposes of SEU hardening. Circuit 175 is coupled to output node 192 and represents or is a model of memory cell load. Notably, loading of a memory cell aids in SEU resistance.

Figure 7:
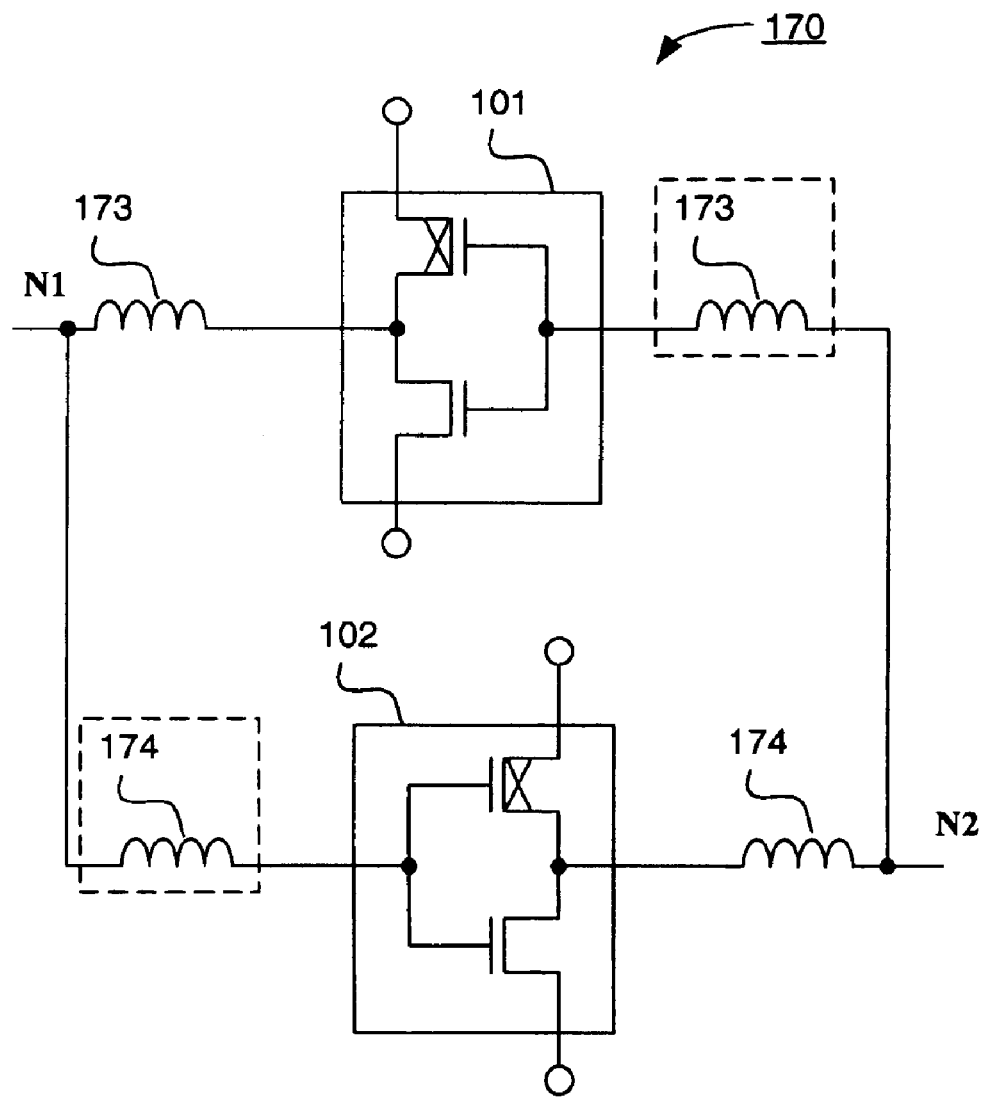
FIG. 7 is a schematic diagram of an alternative exemplary embodiment of a latch in accordance with one or more aspects of the present invention.

Referring to FIG. 7, there is shown a schematic diagram of an exemplary embodiment of a latch 170 in accordance with one or more aspects of the present invention. Latch 170 is similar to latch 100 of FIG. 2 except resistive load transistors 103 and 104 have been replaced with inductors 173 and 174. Optionally, inductors 173 and 174 may be connected to input nodes of inverters 101 and 102, respectively. Placing the inductors on the input sides of nodes N1 and N2 (where a signal applied to the node must traverse the inductor in order to reach the inverter provides better SEU protection (from an upset to a write transistor driving node N1 or N2) but makes the circuit slower. Conversely, placing inductors at the output side allows switching to be faster, protects just as well against an SEU to an inverter transistor, but protects less well against an SEU to a write transistor (not shown in FIG. 7). As another option, the inductors may be split between input and output sides of inverters 101 and 102. Thus, advantageously, inductors 173 and 174 may be connected at either or both of input and output nodes of inverters 101 and 102. It is believed that inductors 173 and 174 represent a high impedance that mitigates against an SEU by limiting or impeding current caused by a cosmic particle. By way of example, suppose a transient of a cosmic particle is approximately 10 pico-seconds (ps) and dI/dt for such a cosmic particle is approximately 1 milli-ampere (ms) in 10 ps. If an inductor of 1 nano-henry is used, resultant voltage (V=−L dI/dt) of approximately 0.1 volt is obtained. Accordingly, with a sufficiently large value of inductance, L, voltage change may be sufficiently constrained to avoid memory upset.

Figure 8:
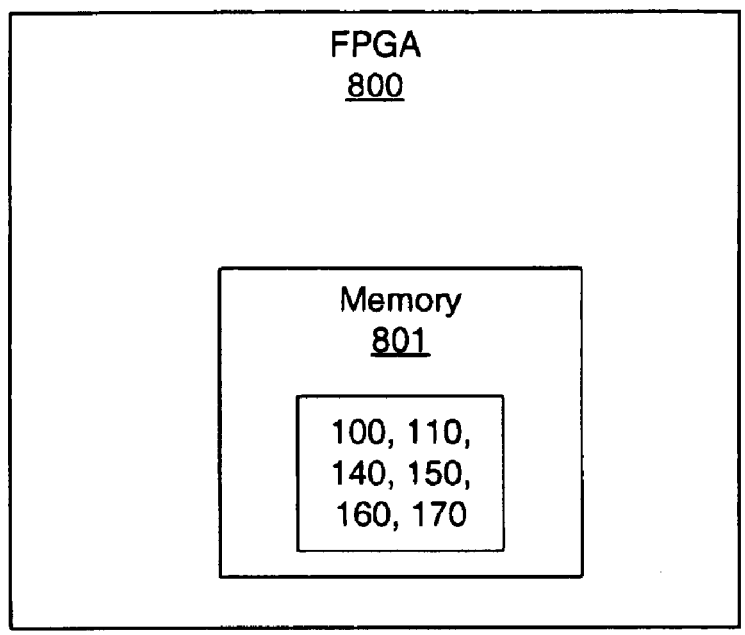
FIG. 8 is a block diagram of an embodiment of an FPGA in accordance with one or more aspects of the present invention.

Referring to FIG. 8, there is shown a block diagram of an embodiment of an FPGA 800 in accordance with one or more aspects of the present invention. FPGA 800 comprises memory 801. Though memory 801 is shown internal to FPGA 800, alternatively memory 801 may be external to FPGA 800 and coupled for communication of data, address and control information. Memory 801 comprises at least one of latches and memory cells 100, 110, 140, 150, 160, and 170, described above.

While the foregoing is directed to the preferred embodiment of the present invention, other and further embodiments of the invention may be devised without departing from the basic scope thereof, and the scope thereof is determined by the claims that follow. Moreover, it should be appreciated that in some embodiments of the present invention only two transistors have been added to provide an SEU hardened device. Additionally, in another embodiment only four transistors have been added to provide an SEU hardened device.

What is claimed is:

1. A memory device having single event upset resistant circuitry, comprising:

a first inverter having a first input node and a first output node;

a second inverter having a second input node and a second output node;

a first transistor having a first source/drain contact coupled to the first input node and a second source/drain contact coupled to the second output node; and a second transistor having a third source/drain contact coupled to the second input node and a fourth source/drain contact coupled to the first output node, wherein each of the first and second transistors is programmable to provide a low resistance less than 1000 ohms and a high resistance of more than 100,000 ohms, wherein each of the first and second transistors has a gate coupled to a gate bias voltage source, the gate bias voltage source putting the first and second transistors into a partially conductive state to provide the high resistances, wherein the first and second transistors are the only transistors coupled to the first inverter and the second inverter to provide the single event upset resistance circuitry, and wherein the first transistor and the second transistor each have a body contact coupled to a body bias source voltage.

2. The memory device of claim 1, wherein the first and second transistors are PMOS transistors.

3. The memory device of claim 1, wherein the memory device comprises a configuration memory cell of a programmable logic device.

* * * * *